United States Patent [19]

Stauffer

[11] Patent Number: 5,399,200
[45] Date of Patent: Mar. 21, 1995

[54] MODULE IN AN INTEGRATED DELIVERY SYSTEM FOR CHEMICAL VAPORS FROM LIQUID SOURCES

[76] Inventor: Craig M. Stauffer, 3066 Scott Blvd., Santa Clara, Calif. 95054

[21] Appl. No.: 209,090

[22] Filed: Mar. 10, 1994

[51] Int. Cl.⁶ .............................................. C23C 16/00
[52] U.S. Cl. ..................................... 118/726; 118/715; 118/725; 392/400; 392/401; 392/403
[58] Field of Search ............... 118/726, 715, 725; 392/400, 401, 403

[56] References Cited

U.S. PATENT DOCUMENTS

| | | | |
|---|---|---|---|
| 4,436,674 | 3/1984 | McMenamin | 261/64 B |
| 4,488,506 | 12/1984 | Heinecke | 118/667 |
| 4,545,801 | 10/1985 | Miyajiri | 65/157 |
| 4,736,705 | 4/1988 | Weyburne | 118/725 |
| 5,024,264 | 6/1991 | Natori | 165/1 |
| 5,079,406 | 1/1992 | Nagy | 219/219 |
| 5,252,134 | 10/1993 | Stauffer | 118/726 |
| 5,322,710 | 6/1994 | Visser | 427/248.1 |

Primary Examiner—R. Bruce Breneman
Assistant Examiner—Jeff Lund
Attorney, Agent, or Firm—Townsend and Townsend Khourie and Crew

[57] ABSTRACT

An integrated module with a heated reservoir to vaporize liquid for semiconductor processes with liquid sources is presented. Shut-off valves and a proportioning pressure valve for controlling the flow of the vapor from the reservoir are mounted on the module for simple conduction heating of the valves. A capacitance manometer also mounted to the module also has its own heating elements. Condensation of the vapor is avoided and consistence performance and reliability is obtained.

12 Claims, 3 Drawing Sheets

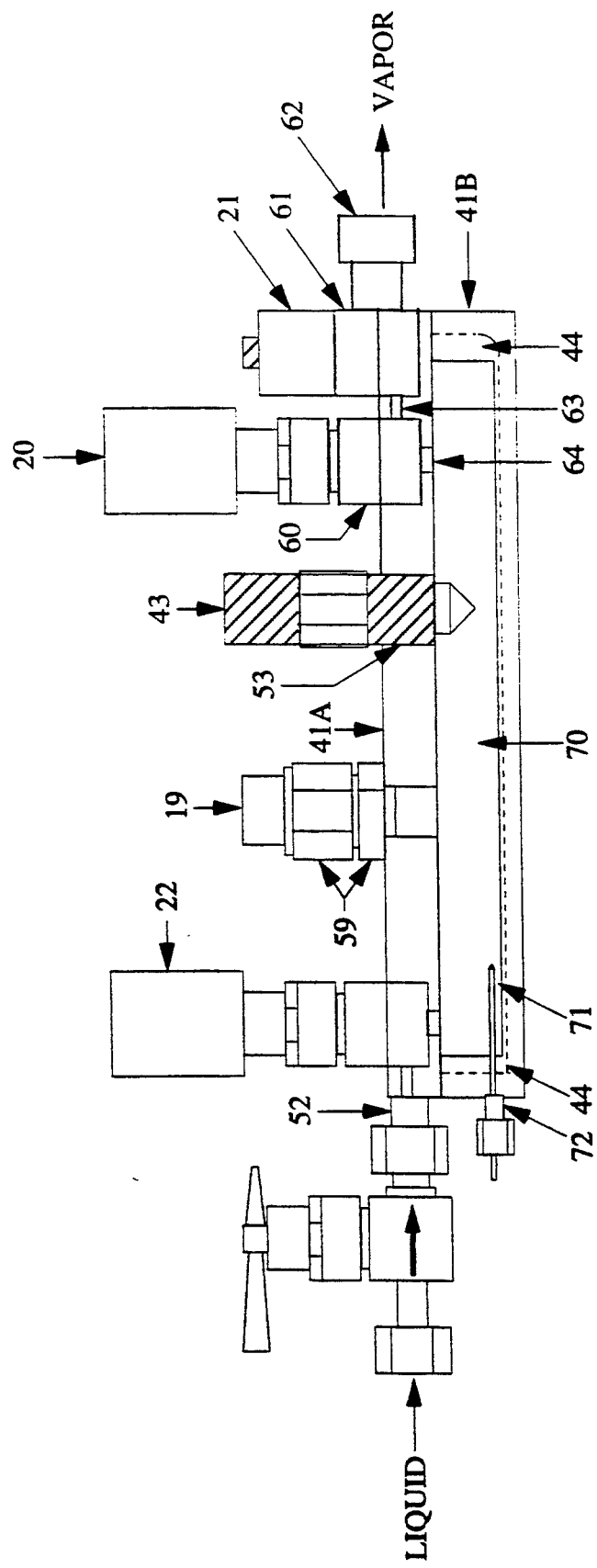

MODULE IN AN INTEGRATED DELIVERY SYSTEM FOR CHEMICAL VAPORS FROM LIQUID SOURCES

BACKGROUND OF THE INVENTION

The present invention relates to semiconductor wafer processing equipment and, more particularly, to delivery systems for chemical vapors from liquid sources.

In the processing of semiconductor wafers, many processes require the delivery of gases into a processing chamber in which one or more semiconductor wafers are placed. Typically these gases at their sources are in the form of gases, such as nitrogen, oxygen, hydrogen, arsine, etc., in pressurized tanks. However, some processes use gases which are liquid at their sources. The liquid is heated to a vapor which is introduced into the processing chamber.

In U.S. Pat. No. 5,252,134, which issued on Oct. 12, 1993 to the present inventor, an integrated delivery system for chemical vapors from liquid sources was described. The described delivery system overcame many of the problems of older, more complex delivery systems which used a discrete bubbler unit or heated reservoirs. In these complex systems other discrete units, such as valves, pressure and mass flow controllers, and the feed line through which the chemical vapor passes, were connected between the bubbler or reservoir unit and the processing chamber. Each of the discrete units were often heated. In any case, problems arose with these complicated delivery systems, including condensation at the unheated or inadequately heated points of the system.

Nonetheless, while the described system overcame the problems of reliability and the consistency of performance in the older delivery systems, performance in the described system can still be improved. This is especially true for liquid sources containing silylation agents where very small variations in temperature and pressure in the delivery module of the chemical vapor have large effects on the results, such as the rate of reaction, thickness of deposited or grown film, etc.

The present invention offers improvements in the described delivery system which solves or substantially mitigates even very small variations in temperature and pressure in the delivery module of the chemical vapor.

SUMMARY OF THE INVENTION

The present invention provides for an integrated module for the delivery of chemical vapor from a liquid source through an inlet to a processing chamber of a processing unit for semiconductor wafers. The module comprises a metal housing defining a reservoir for holding a liquid from the source, a supply channel connecting the reservoir to a supply inlet for connection to the source, a gas channel connecting the reservoir to an outlet, and fittings for mounting the housing to the processing unit such that the outlet is connected to the processing chamber inlet. Valves in the housing connected to the gas channel control the delivery of the vapor from the reservoir to the processing chamber. Heating elements in the housing heat the reservoir so that liquid in the reservoir is transformed into vapor. From the heating elements a heat transfer plate extends through a vapor region into the reservoir so that the module controllably and precisely supplies vapor at a constant, uniform and repeatable temperature from the liquid supply to the processing chamber.

BRIEF DESCRIPTION OF THE DRAWINGS

A clear understanding of the present invention may be achieved by perusing the following detailed Description of Specific Embodiments with reference to the following drawings:

FIG. 2A is a cross-sectional side view of the integrated chemical vapor delivery module according to the present invention.

DETAILED DESCRIPTION OF SPECIFIC EMBODIMENT(S)

Figure 1:
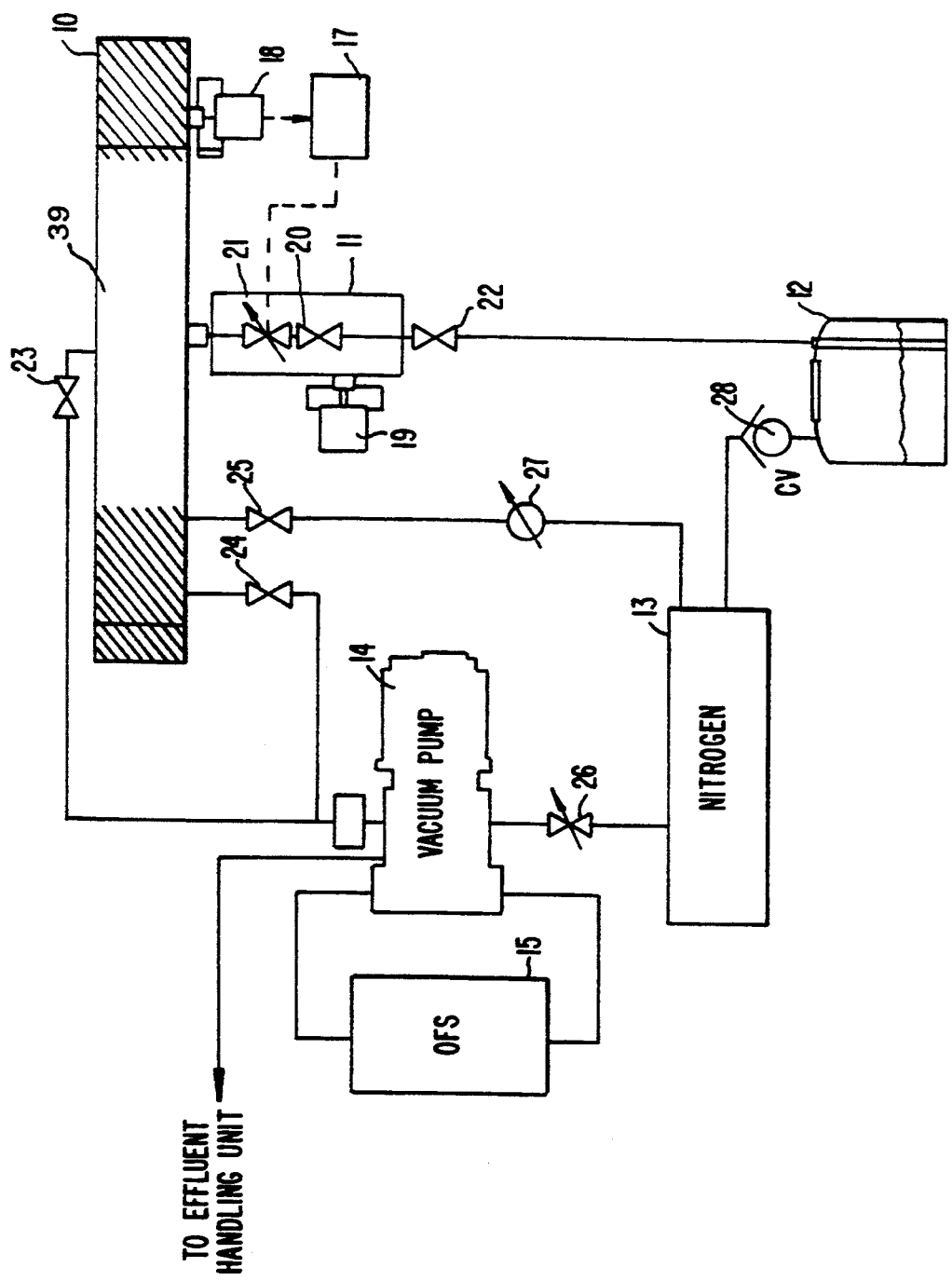
FIG. 1 is an overall schematic view of a chemical vapor reactor into which the present invention is adapted.

For a better understanding of the present invention, FIG. 1 is an overall schematic illustration of a semiconductor processing system with one embodiment of a chemical vapor delivery system in accordance with the patent noted above. The delivery system has an integrated chemical delivery module 11 which is attached to a processing unit 10 containing a processing chamber in which a semiconductor wafer is placed during processing. The module 11 supplies chemical vapor into the processing chamber from a supply 12 of chemicals in liquid form.

A vacuum pump 14 removes gas from the processing chamber through valves 23 and 24, which maintains a vacuum in the processing chamber. The vacuum pump 14 is also connected to an effluent handling unit (not shown) and an oil filtration system unit 15 for removing contaminants from the pump oil.

A source 13 supplies nitrogen for the processing chamber 9 through a valve 25 and a flow meter 27. The valve 25 backfills the processing chamber with $N_2$ when the processing chamber is raised from a vacuum to atmospheric pressure. The nitrogen source 13 is connected to the pump 14 through a valve 26. The nitrogen to the pump 14 purges the pump oil to reduce the retention of contaminants, such as silylating agents, in the oil. Finally the nitrogen source 13 is connected to the liquid source 12 to pressurize the source 12 to supply liquid to the module 11. A check valve 28 prevents backing of the liquid to the nitrogen source 13.

To monitor the pressure within the processing chamber, a capacitance manometer 18 is attached to the processing unit 10 and coupled to the processing chamber. The manometer 18 is coupled to an electronic control unit 17 which is connected to a proportioning pressure valve 21 in the module 11. Not shown in the drawing are heating units to maintain the temperature of the processing chamber at a desired temperature.

The module 11 has a reservoir which receives the chemical liquid from the liquid supply 12 through a liquid refill valve 22, a shut-off valve, which is integrally mounted to module 11. The reservoir is heated to change the liquid into a chemical vapor which then passes through a vapor shutoff valve 20 and the proportioning pressure valve 21. The valves 20, 21 and 22 are integrally mounted to the module 11. Responsive to the signals from the unit 17, the valve 21 controls the pressure in the processing chamber by supplying more or less chemical vapor to the chamber. The module 11 also has a pressure sensor, such as a capacitance manometer 19, for accurately monitoring the pressure of the chemical vapor within the reservoir.

Figure 2B:
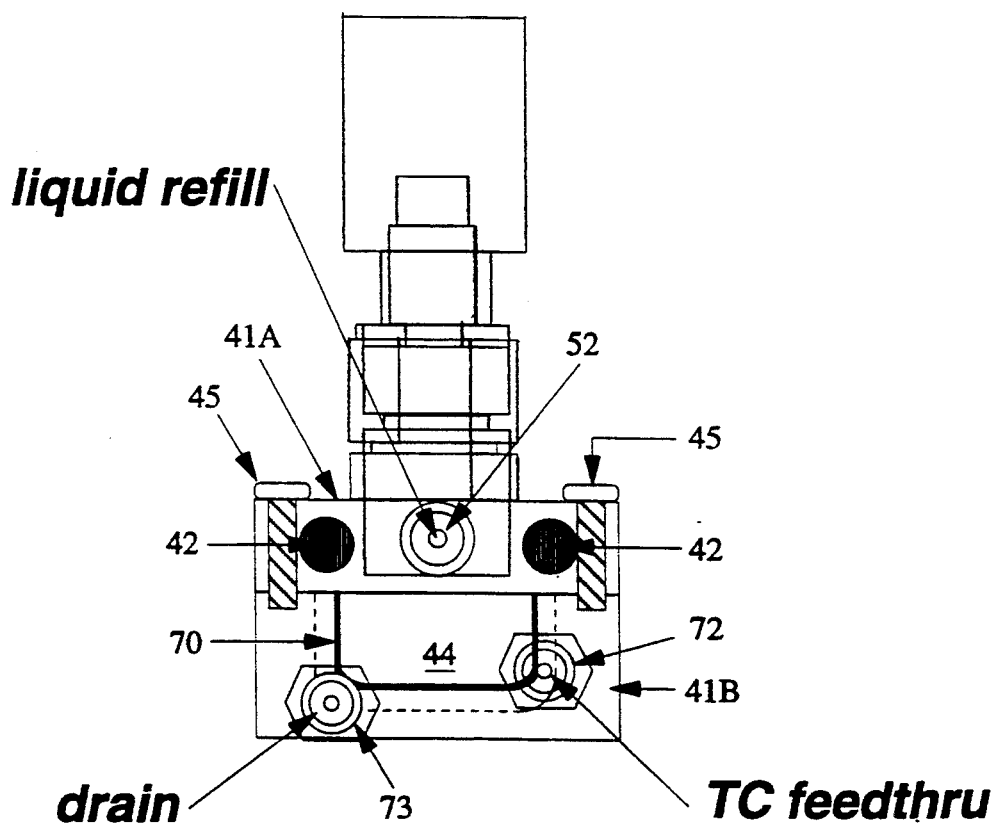
FIG. 2B is another cross-sectional side view of the module of FIG. 2A.

FIGS. 2A and 2B show the details of the structure of the module 11 more clearly. As shown in FIG. 2A, the module 11 has an upper housing unit 41A and a lower housing unit 41B, both of which are made from stainless steel. For operation, the units 41A and 41B are clamped together by bolts 45 shown in FIG. 2B.

In the lower housing unit 41B there is the liquid reservoir 44 outlined by a dotted line. A fitting 52 connects a liquid supply source to the seat of valve 22 which, upon opening, allows the refill of the reservoir 44. The fitting 52 is connected to the liquid refill valve 22, which is connected to the liquid source 12 by a refill line. The valve 22 is integral with the module 11 and forms a liquid supply channel with the fitting 52 and the refill line. Also shown in FIG. 2B, but not in FIG. 2A, is a fitting 73 for a drain of the liquid in the reservoir. As an aside, it should be noted that all fittings are vacuum-tight to prevent leakage of liquid or vapor.

Mounted to the top housing 41A is the proportioning pressure valve 21, the vapor shutoff feed valve 20, the capacitance manometer 19, and the liquid level sensor 43. The sensor 43 is mounted to the housing 41A by a threaded (NPT) fitting 53. The sensor 43, determines the level of the liquid in the reservoir 44 so that the valve 22 can keep the reservoir 44 filled with liquid to a very precise and repeatable level.

The manometer 19, is attached to the housing unit 41A by a fitting 59, mounted to the unit 41A. The capacitance manometer 19 accurately measures the pressure (and hence the module condition) of the vaporized liquid from the reservoir 44 as a check on the pressure.

The proportioning pressure valve 21 is mounted to the housing 41A by a fitting 61. The vapor shutoff valve 20 is mounted to the housing 41A by a fitting 60. Vapor from the reservoir 44 flows through a channel 64 to the seat of the valve 20. When the valve 20 is opened, vapor flows from the valve outlet through a channel 63 to the input of the proportioning valve 21. The highly precise opening of the valve 21 allows the vapor to flow through the valve seat and into the chamber through an outlet fitting 62. The proportioning valve 21 controls flow or pressure very accurately through modulation of magnetic field created by the valve coil. The shutoff valve 20 is an air-operated bellows-type and offers a more positive and complete closure of the vapor path to the chamber than is offered by the proportioning valve 21 alone. Therefore the channels 64 and 63, when combined with the action of the valves 20 and 21, supply both positive, leak-tight, shut-off and highly precise and responsive control of flow or pressure via flow.

Also mounted lengthwise in the top housing 41A are two resistance rod heaters 42, shown in cross-section in FIG. 2B. The rod heaters are inserted in one-quarter inch diameter holes drilled . lengthwise in the housing 41A. With an electric current, the heaters 42 heat the units 41A and 41B and the liquid in the reservoir 44.

For additional heating to augment the thermal energy from the rods 42, piezoelectric transducers may also be mounted to the housing 41A, 41B. The sonic energy from the transducers, operating in a range of 600–1800 KHz, provide another source of heating to the reservoir 44 and the liquid and vapor in and from the reservoir 44.

As in many present day semiconductor processing equipment, the control unit 17 of FIG. 1 has a microprocessor, which controls the functions of the module 11 by well-known programming techniques. Furthermore, not all the electrical connections from the valves and sensors are shown in the drawings. From the feedback signals of the manometer 18, the microprocessor controls the proportioning pressure valve 21 to maintain the processing chamber at the desired pressure. The microprocessor also controls the temperature of the reservoir 44 through the heating rods 42 to maintain the vapor in the module 11 at a desired temperature and pressure, and controls the liquid resupply of the reservoir 44 through the refill valve 22 under the feedback control signals from the liquid level sensor 43.

Further details of the system described above may be found in the referenced patent.

The described system does very well in the delivery of chemical vapors containing silylation agents, which are very sensitive to variations in temperature and pressure. However, under certain circumstances it has been found that temperature and pressure variations have been observed in the module 11, yet no variations were observed in the processing chamber. These circumstances occur when the wafers are rapidly cycled through the processing chamber. The variations are small, typically less than 10 Torr and 3°–5° C. in the module 11 with processes nominally set in the range of 30–100 Torr and 35°–160° C.

Contrary to what might be expected, these variations in the module 11 had an effect upon the wafers being processed through the chamber, even though temperature and pressure variations were not observed in the chamber. The cause of these variations was discovered to be quite subtle, though with significant effects. At the beginning of wafer processing through the chamber, the heated liquid in the vapor phase and the chemical liquid in the module's reservoir 44 are at equal temperature. When the valves 20 and 21 are opened, substantially all of the chemical vapor enters the process chamber and possibly some of the liquid changes into the vapor phase and passes into the chamber. Depending upon the particular temperature of the process, evaporative cooling causes the liquid and vapor temperatures in the module 11 to slowly degrade as more wafers are cycled through the chamber. Consistency and repeatability of results in the process chamber are lost, despite constant and repeatable temperature and pressure within the chamber.

Some numbers highlight the subtlety of the cause of these variations. The reservoir 44 holds a 100 ml volume of liquid and each time the valve 21 is opened, 0.1–0.25 ml of liquid in vapor form is sent into the process chamber. In one test, after the rapid cycling of 10 wafers, a drop of 2.0° C. in the temperature of the reservoir liquid and a drop in the module 11 pressure from 98 Torr to 93.5 Torr have been observed. Nonetheless, with no observable changes in the pressure and temperature in the chamber,, the silylation rate of the wafers dropped by one-half.

To solve this problem, the present invention provides for a heat transfer plate 70, as shown in FIGS. 2A and 2B. The heat transfer plate 70 is formed from a metal plate shaped into a "U" cross-section, as illustrated by FIG. 2B, and nearly as long as the reservoir 44. Opposite edges of the plate 70 form the two legs of the "U". The edges are used as bases which are attached to the bottom surface of the upper housing unit 41A by welding or metal screws. As shown in FIG. 2B, the edges are attached in close proximity to and along the length of the rod heaters 42. The plate 70, made from thermally conductive material, such as stainless steel or copper, extends through the vapor region over the entire reservoir 44 into the reservoir itself so that the plate 70 also contacts the liquid in the reservoir. The plate 70 is approximately ⅛" from the bottom of the reservoir and ⅛" from its sides. Openings are made in the plate 70 to avoid interference with the operation of other elements of the module 11. For example, if an optical sensor is used for the liquid level sensor 43, an opening is made in the plate 70 directly below the sensor 43.

A thermocouple 71 is also inserted through the wall of the lower housing unit 41B to permit direct monitoring of the liquid in the reservoir 44. A fitting 72, such as Model 2MTC2N from Parker Hannafin of Huntsville, Ala., is used to seal the thermocouple, either J-type or K-type, to effect a vacuum seal for the reservoir 44.

The thermocouple 71 gives a precise and instantaneous measurement of temperature of the liquid in the reservoir 44. The thermocouple 71 signals the control unit (not shown), which controls the heating rods 42. Since the bases of the heat transfer fin 70 are very close to the heating rods 42, heating of the liquid in the reservoir 44 is immediate. Heat passes from the rods 42, through the lower housing unit 41B to the fin 70 and into the liquid. Furthermore, the plate 70 is in close contact with the vapor above the reservoir 44 for a near-instantaneous heating of the vapor. Temperature, and pressure, of the vapor and reservoir liquid is maintained precisely and uniformly as the valves 20 and 21 are opened in each wafer processing cycle.

It should be noted that the heating elements and heat transfer plates could be added or placed in locations other than described above. For example, heating rods might be placed below the liquid reservoir in a modified lower housing unit with one or more heat transfer plates extending from the heating rods through the reservoir into the vapor region above the liquid reservoir.

Without the fin 70, only less direct heating paths remain. Heat is transferred by convection from the bottom surface of the upper housing unit 41A into the chemical vapor and to the surface of the liquid, and by conduction from the upper housing unit 41A into the lower housing unit 41B forming the sidewalls and bottom of the reservoir, and into the liquid. Surprisingly, as explained above, these heat transfer paths are insufficient for silylation agents in certain circumstances and result in unacceptable process variations.

With the present invention, consistency and repeatability of results are maintained even as wafers are quickly cycled through the process chamber 10. An extension of the cycle time, with the consequent and undesirable reduction in wafer throughput, is avoided.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by metes and bounds of the appended claims.

What is claimed is:

1. An integrated module for the delivery of chemical vapor from a liquid source through an inlet to a processing chamber of a processing unit for semiconductor wafers, said module comprising
    a metal housing defining a reservoir for holding a liquid from said source;
    a supply channel connecting said reservoir to a supply inlet for connection to said source;
    a gas channel connecting said reservoir to an outlet;
    means for mounting said housing to said processing unit such that said outlet is connected to said processing chamber inlet;
    means in said housing for heating said reservoir so that liquid in said reservoir is transformed into vapor, said heating means including a heat transfer plate extending into said reservoir to heat said liquid; and
    means connected to said gas channel for controlling the delivery of said vapor from said reservoir to said processing chamber;
    whereby said module controllably and precisely supplies vapor at a constant, uniform and repeatable temperature from said liquid supply to said processing chamber.

2. The module as in claim 1 wherein said heat transfer plate has a portion for heating said vapor.

3. The module as in claim 2 wherein said housing comprises upper and lower units, said lower unit defining said reservoir, said heating means having a heating element in said upper unit, said heat transfer plate mounted to said upper unit and extending into said reservoir.

4. The module as in claim 3 wherein said heating element comprises at least one heating rod in said upper housing, said heating rod having a longitudinal axis; and said heat transfer plate has an elongated base mounted to said upper housing unit, said elongated base parallel to said longitudinal axis and in close proximity with said heating rod.

5. The module as in claim 4 wherein said heating element comprises two heating rods, each heating rod having a longitudinal axis, said heating rods mounted in said upper housing with longitudinal axes parallel to each other; and wherein said heat transfer plate has two opposite edges and a U-shaped cross-section, said opposite edges forming a top portion of said U-shaped cross-section and elongated bases of said heat transfer plate, each elongated base mounted to said upper housing unit in close proximity with one of said heating rods and parallel to said longitudinal axis of said one heating rod.

6. The module as in claim 1 further comprising a means for directly sensing temperature of said liquid in said reservoir, said heating means heating said liquid in said reservoir responsive to said temperature sensing means.

7. The module as in claim 6 further comprising a thermocouple mounted to said lower housing unit in said reservoir, said heating element heating said liquid in said reservoir responsive to said thermocouple.

8. The module as in claim 1 wherein said liquid comprises a silylation agent.

9. An integrated module for the delivery of chemical vapor from a liquid source through an inlet to a processing chamber of a processing unit for semiconductor wafers, said module comprising
    a metal housing defining a reservoir therein for holding a liquid having a silylation agent from said source;
    a supply channel in said housing connecting said reservoir to a supply inlet for connection to said source;
    a gas channel in said housing connecting said reservoir to an outlet;
    means for mounting said housing to said processing unit such that said outlet is connected to said processing chamber inlet;

means mounted in said reservoir for directly sensing the temperature of said liquid;

heating elements in said housing for heating said reservoir so that liquid in said reservoir is transformed into vapor and for maintaining the temperature of said liquid responsive to said temperature sensing means;

a heat transfer plate mounted to said housing proximate said heating elements and extending into said reservoir; and means integrally mounted to said housing and connected to said gas channel for controlling the delivery of said vapor from said reservoir to said processing chamber;

whereby said module controllably and precisely supplies vapor at a constant, uniform and repeatable temperature from said liquid supply to said processing chamber.

10. The module as in claim 9 wherein said housing comprises upper and lower housing units, said reservoir defined by said lower housing unit, said upper housing unit having a lower surface mating with said lower housing unit to seal said reservoir, said heating elements in said upper housing unit, and said heat transfer plate mounted to said lower surface of said upper housing unit and extending into said reservoir.

11. The module as in claim 10 wherein said heating elements comprise two heating rods fixed in parallel in said upper housing unit, and said heat transfer plate having two opposite edges and a U-shaped cross-section, said opposite edges forming a top portion of said U-shaped cross-section, each opposite edge mounted to said lower surface in close proximity with one of said heating rods and parallel to one heating rod.

12. The module as in claim 11 wherein said temperature sensing means comprises a thermocouple mounted to said lower housing unit.

* * * * *